US010571816B2

(12) United States Patent
Wesselingh et al.

(10) Patent No.: US 10,571,816 B2
(45) Date of Patent: Feb. 25, 2020

(54) ASSEMBLY IN A MICROLITHOGRAPHIC PROJECTION EXPOSURE APPARATUS

(71) Applicant: Carl Zeiss SMT GmbH, Oberkochen (DE)

(72) Inventors: Jasper Wesselingh, Moettingen (DE); Michael Erath, Dietenheim (DE); Ansgar Holle, Heidenheim (DE); Stefan Troeger, Ulm (DE); Alexander Vogler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/417,435

(22) Filed: May 20, 2019

(65) Prior Publication Data
US 2019/0361362 A1 Nov. 28, 2019

(30) Foreign Application Priority Data

May 22, 2018 (DE) .......................... 10 2018 207 949

(51) Int. Cl.
*G03F 7/20* (2006.01)
(52) U.S. Cl.
CPC ........ *G03F 7/70975* (2013.01); *G03F 7/7015* (2013.01); *G03F 7/70808* (2013.01)
(58) Field of Classification Search
CPC .............. G03F 7/7015; G03F 7/70975; G03F 7/70808; G03F 7/709; G03F 7/70825;
(Continued)

(56) References Cited

U.S. PATENT DOCUMENTS

2003/0052284 A1* 3/2003 Hol ..................... G03F 7/70716
250/548
2005/0094118 A1* 5/2005 Dams .................. G03F 7/70758
355/53
(Continued)

FOREIGN PATENT DOCUMENTS

DE 10 2009 054 549 A1 6/2010
DE 10 2011 004 607 A1 1/2012
DE 10 2013 204 317 A1 3/2014

OTHER PUBLICATIONS

R. Deng, R. Saathof, J.W. Spronck, S. Hol, R. Munnig Schmidt: "*Integrated 6-DoF Lorentz Actuator with Gravity Compensator for Precision Positioning*", 2014, Proc. 22nd Intl. Conf. on Magnetically Levitated Systems and Linear Drives.
(Continued)

*Primary Examiner* — Steven Whitesell Gordon
(74) *Attorney, Agent, or Firm* — Fish & Richardson P.C.

(57) ABSTRACT

The disclosure relates to an assembly in a microlithographic projection exposure apparatus, with an optical element and at least one weight compensating device, which includes at least one magnetic circuit. A magnetic field generated by this magnetic circuit brings about a force for compensating at least partially for the force of the weight acting on the optical element. The apparatus also includes a coil arrangement with a plurality of coils. The arrangement is energizable with electrical current to generate a compensating force acting on the optical element. This compensating force compensates at least partially for a parasitic force that is exerted by the magnetic circuit when there is movement of the optical element and does not contribute to the compensation for the force of the weight acting on the optical element.

19 Claims, 5 Drawing Sheets

(58) Field of Classification Search
CPC . G03F 7/70816; G03F 7/70833; H02N 15/00;
F16C 32/0417; G02B 7/1828
See application file for complete search history.

(56) References Cited

U.S. PATENT DOCUMENTS

| | | | |
|---|---|---|---|
| 2011/0267596 A1* | 11/2011 | Muehlberger | G03F 7/70825 355/67 |
| 2015/0212430 A1* | 7/2015 | Boon | G03F 7/70758 355/72 |
| 2016/0216611 A1* | 7/2016 | Nefzi | G03F 7/70058 |

OTHER PUBLICATIONS

GPTO—Office Action, with translation thereof, for corresponding DE 10 2018 207 949.8, dated Jan. 16, 2019.

* cited by examiner

ASSEMBLY IN A MICROLITHOGRAPHIC PROJECTION EXPOSURE APPARATUS

CROSS REFERENCE TO RELATED APPLICATION

This application claims priority of German Patent Application DE 10 2018 207 949.8 filed on May 22, 2018. The contents of this application are hereby incorporated by reference.

FIELD

The disclosure relates to an assembly in a microlithographic projection exposure apparatus.

BACKGROUND

Microlithography is used for producing microstructured components, such as for example integrated circuits or LCDs. The microlithography process is carried out in what is called a projection exposure apparatus, which includes an illumination device and a projection lens. The image of a mask(=reticle) illuminated via the illumination device is in this case projected via the projection lens onto a substrate (for example a silicon wafer) coated with a light-sensitive layer (photoresist) and arranged in the image plane of the projection lens, in order to transfer the mask structure to the light-sensitive coating of the substrate.

In a projection exposure apparatus designed for EUV (for example for wavelengths of for instance approximately 13 nm or approximately 7 nm), mirrors are used as optical components for the imaging process because of the unavailability of light-transmissive materials. These mirrors may for example be mounted on a supporting frame and be designed as at least partially manipulable, in order to allow a movement of the respective mirror in six degrees of freedom (i.e. with respect to displacements in the three spatial directions x, y and z and also with respect to rotations $R_x$, $R_y$ and $R_z$ about the corresponding axes). This allows compensations to be made for changes in the optical properties that occur for instance during the operation of the projection exposure apparatus, for example as a result of thermal influences.

Figure 4:
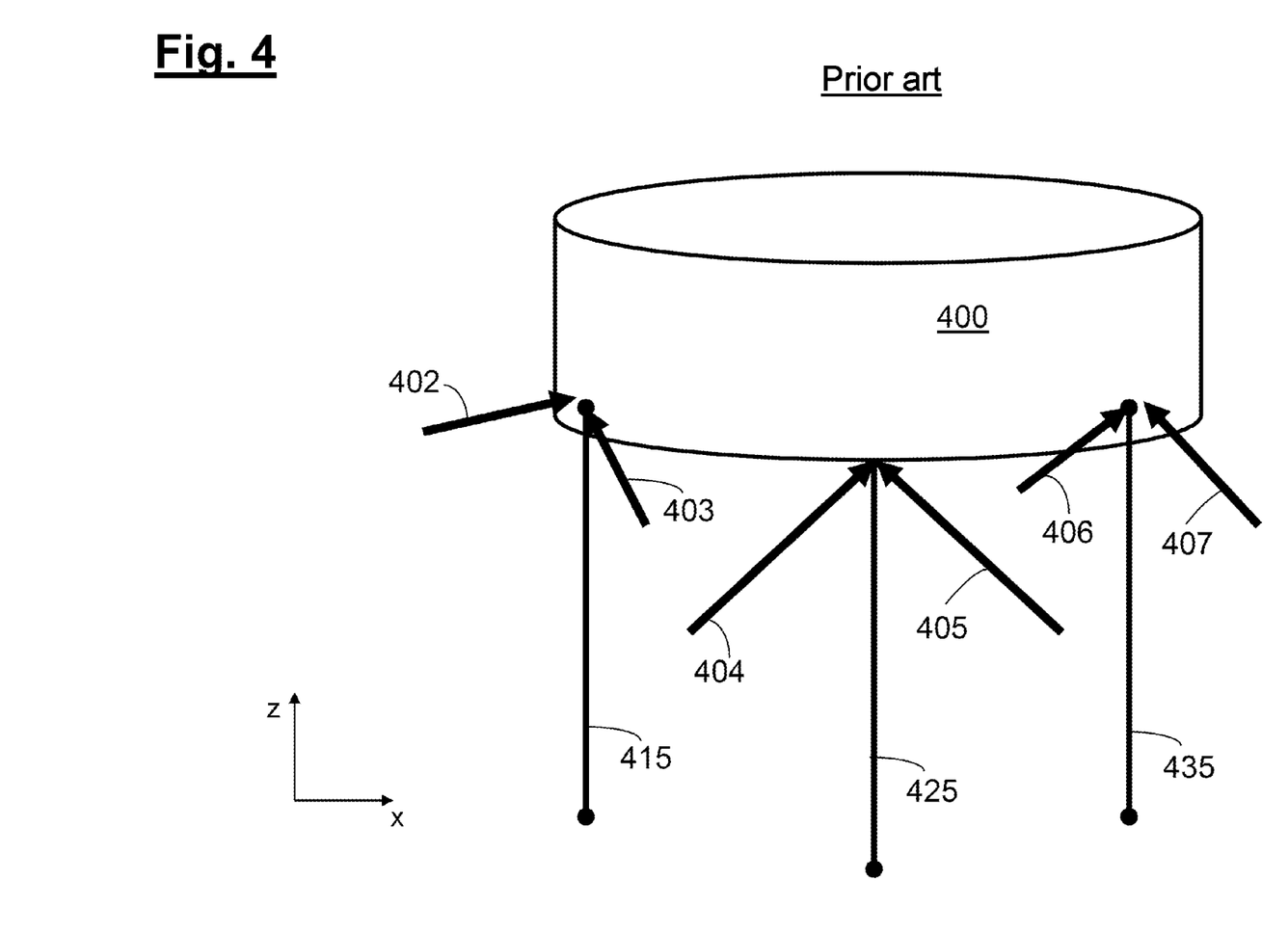
FIG. 4 shows a schematic representation for explaining a conventional construction for the manipulation of a mirror in six degrees of freedom.

It is for example known to use in a projection lens of an EUV projection exposure apparatus for the manipulation of optical elements such as mirrors in up to six degrees of freedom—as schematically indicated in FIG. 4—three actuator arrangements, which respectively include at least two Lorentz actuators 402 and 403, 404 and 405 and also 406 and 407 (i.e. two actively activatable axes of movement in each case). Also provided in the construction from FIG. 4 for each of these actuator arrangements or for each associated point of force introduction there is in each case a weight compensating device bearing the weight of an optical element or mirror 400, in order to minimize the energy consumption of the active or controllable adjusting elements, so that in this respect no permanent energy flow with accompanying heat generation is required. The weight compensating device, also referred to as "MGC"(="Magnetic Gravity Compensator"), can be set to a certain holding force, which is transmitted to the mirror 400 by a mechanical element (pin) 415, 425 or 435 that is mechanically coupled to the mirror 400.

Figure 5:
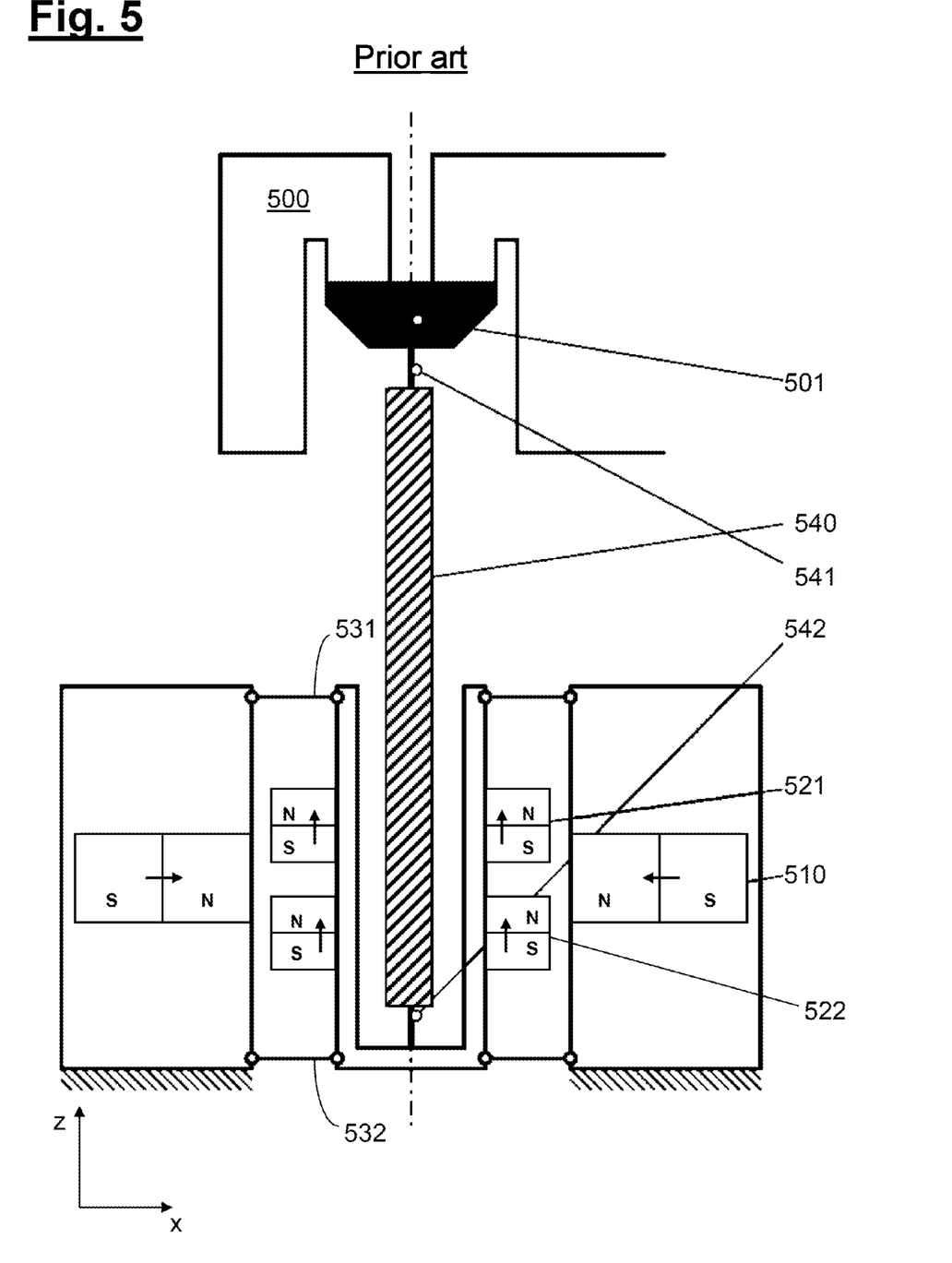
FIG. 5 shows a schematic representation for explaining a conventional construction of a weight compensating device.

According to FIG. 5, the magnetic circuit itself conventionally includes a (passive) magnetic circuit made up of an outer magnetic ring 510, which in the example represented is polarized radially with respect to the z axis extending in the driving direction, and two magnetic rings 521, 522 arranged radially further inward, which in the exemplary embodiment represented are respectively polarized axially with respect to the z axis, both the outer magnetic ring 510 and the inner magnetic rings 521, 522 being formed in each case as permanent magnets. This assembly is guided by way of a linear guide, formed by a system of parallel springs including leaf springs 531, 532. The pin mechanically coupled to the mirror (denoted in FIG. 5 by "500") or a bearing bush 501 formed on the latter in the example of FIG. 5, is denoted in FIG. 5 by "540" and for its part includes two flexures 541, 542 formed as leaf spring joints, by way of which a flexible attachment to the mirror 500 in all directions apart from the axial z direction is achieved.

However, with the mechanical attachment of a weight compensating device described above by way of a pin according to FIG. 5, there is the issue that the pin 540 itself has dynamic vibration modes on account of possible bending movements of the pin. These internal vibration modes may on the one hand impair the stability of the positional control of the mirror concerned and on the other hand impair the effectiveness of the desired mechanical decoupling in the higher frequency range, with the consequence that the sensitivity of the mirror with respect to disturbances in the higher frequency range increases.

One way of overcoming the impairment of the dynamic behaviour described above includes eliminating a mechanical attachment in the form of a pin by using magnetic forces for the coupling, the pin being replaced by an (air) gap and the radially inner magnetic rings 521, 522 from FIG. 5 being mounted directly on the mirror 500. However, a resultant desire to dispense with any mechanical guidance then has the disadvantage that, during a typically intended movement of the mirror taking place in six degrees of freedom, varying distances between the magnetic rings forming the passive magnetic circuit have the effect that comparatively high parasitic forces are transmitted to the mirror by the weight compensating device, which in turn leads to undesired deformations of the optically effective surface of the mirror concerned, and consequently to an impairment of the performance of the optical system. Minimizing these parasitic forces by optimizing the design of the passive magnetic circuit has proven to be difficult to realize here because of unavoidable magnetic and geometrical tolerances.

Furthermore, the magnetic coupling described above also represents a demanding challenge to the extent that, to avoid the introduction of parasitic moments to the mirror and accompanying deformations, the force transmission through the magnetic circuit has to take place as close as possible to the neutral plane of the mirror, which in turn can prove to be difficult from aspects of installation space.

Reference is made merely by way of example to DE 10 2009 054 549 A1 and the publication R. Deng, R. Saathof, J. W. Spronck, S. Hol, R. Munnig Schmidt: *"Integrated 6-DoF Lorentz Actuator with Gravity Compensator for Precision Positioning"*, 2014, Proc. 22nd Intl. Conf. on Magnetically Levitated Systems and Linear Drives.

SUMMARY

The present disclosure seeks to provide an assembly in a microlithographic projection exposure apparatus that allows actuation of an optical element that is as untroubled as possible while at least largely avoiding issues described above.

In a general aspect, the disclosure provides an assembly in a microlithographic projection exposure apparatus. The assembly includes an optical element, and at least one weight compensating device, which includes at least one magnetic circuit. A magnetic field generated by the magnetic circuit brings about a force for compensating at least partially for the force of the weight acting on the optical element. The assembly also includes a coil arrangement with a plurality of coils. The coil arrangement is energizable with electrical current to generate a compensating force acting on the optical element. The compensating force compensates at least partially for a parasitic force that is exerted by the magnetic circuit when there is movement of the optical element and does not contribute to the compensation for the force of the weight acting on the optical element.

An assembly according to the disclosure, in particular in a microlithographic projection exposure apparatus, includes:
  an optical element;
  at least one weight compensating device, which includes at least one magnetic circuit, a magnetic field generated by this magnetic circuit bringing about a force for compensating at least partially for the force of the weight acting on the optical element; and
  a coil arrangement with a plurality of coils, the coil arrangement being energizable with electrical current to generate a compensating force acting on the optical element, this compensating force compensating at least partially for a parasitic force that is exerted by the magnetic circuit when there is movement of the optical element and does not contribute to the compensation for the force of the weight acting on the optical element.

The disclosure is at least partially based in particular on the concept for an assembly with a weight compensating device for compensating at least partially for the force of the weight acting on an optical element, such as for example a mirror, of on the one hand dispensing with any mechanical attachment (such as for example the pin explained at the beginning) in it between the weight compensating device and the optical element in favour of a magnetic attachment and on the other hand of actively compensating for the parasitic forces that occur when there is movement of the optical element as a result of dispensing with mechanical attachment in this way, and in particular as a result of the absence of mechanical guidance for the magnets involved for the magnetic attachment, by the use of a coil arrangement that can be energized with electrical current.

The coils that are present in the coil arrangement according to the disclosure and can be energized with electrical current are consequently used as adjusting elements for compensating for parasitic forces or disturbing forces that are caused by the positional change of the magnets present that results from a movement of the optical element or mirror, it being possible for the position-dependently occurring disturbing forces concerned to be determined for example in a calibration carried out in advance on the basis of knowledge of the positional changes of the optical element or the magnets to be expected during operation, or else to be measured during operation by force sensors present at suitable positions. The energizing of the coils present in the coil arrangement according to the disclosure can then accordingly be performed in precisely such a way that the disturbing forces are compensated and undesired deformations of the optical element or mirror are avoided, or at least substantially reduced.

According to the disclosure, consequently the disadvantages caused in a conventional weight compensating device, with for example the construction described on the basis of FIG. 5, due to the mechanical attachment of the weight compensating device to the optical element concerned are avoided and at the same time the issues likewise discussed at the beginning that are involved in realizing a purely magnetic attachment and doing away with mechanical guidance are overcome.

At the same time, the disclosure also includes the principle of placing the coils that are used for the active compensation of disturbing forces occurring and can be energized with electrical current in the stray field of the passive magnetic circuit of the weight compensating device.

This arrangement has the advantage in comparison with placement directly between the components of the assembly that are movable in relation to one another (in particular placement in the region of the gap between the respective magnets) that the design of the weight compensating device itself can be formed or optimized independently of the specific desired properties of the active disturbing force compensation according to the disclosure by way of the coil arrangement, and in particular no compromises are necessary with regard to the configuration of the (passive) magnetic circuit present in the weight compensating device.

This is so because, according to the disclosure, it is possible to exploit the fact that the magnetic field lines of the magnetic field generated by the passive magnetic circuit are also present outside the (gap) region that is actually used for the weight compensating effect, to be specific especially also in the stray field, so that this stray field—which conventionally remains unused—can be used for the active generation of compensating forces for disturbing force compensation by the coil arrangement according to the disclosure.

In addition to the aforementioned possibility of optimizing the weight compensating device independently of the coil arrangement according to the disclosure, the placement of the coil arrangement in the stray magnetic field of the passive magnetic circuit of the weight compensating device also makes it possible to realize a particularly compact overall construction, which is advantageous on the one hand from aspects of installation space and on the other hand also with regard to the desirable placement of the coil arrangement as close as possible to the magnets of the passive magnetic circuit to realize sufficiently great compensating forces.

A further advantage of dispensing with a magnetic attachment and guidance between the force compensating device and the optical element as proposed by the disclosure arises as a result of the elimination of movable flexures, such as for example leaf springs, that are present in the conventional construction from FIG. 5, with the consequence that failure rates can be reduced and the lifetime of the assembly can be increased.

According to one embodiment, the coils of the coil arrangement can be energized with electrical current independently of one another.

According to one embodiment, the coil arrangement includes at least five coils, in particular at least six coils.

According to one embodiment, at least some of the coils are offset azimuthally with respect to a system axis of the weight compensating device.

According to one embodiment, the coil arrangement includes a first group of coils that are offset in relation to one another azimuthally with respect to a system axis of the weight compensating device and a second group of coils that are offset in relation to one another azimuthally with respect to the system axis.

According to one embodiment, the coils of the first group are offset azimuthally in relation to the coils of the second group.

According to one embodiment, at least one magnet of the magnetic circuit is fixed on the optical element.

According to one embodiment, at least one magnet of the magnetic circuit is fixed on a stationary supporting frame.

According to one embodiment, the weight compensating device has a part that is stationary in relation to the optical element and is coupled to the optical element exclusively by way of magnetic forces.

According to one embodiment, the weight compensating device includes a first magnetic ring and at least one second magnetic ring, the at least one second magnetic ring being arranged radially further inward with respect to a system axis of the weight compensating device than the one first magnetic ring.

According to one embodiment, the coil arrangement is arranged outside a gap located between the first magnetic ring and the second magnetic ring.

According to one embodiment, the assembly includes at least one force sensor for measuring a parasitic force exerted by the magnetic circuit when there is movement of the optical element.

According to one embodiment, the optical element is a mirror.

The disclosure also relates to an optical system of a microlithographic projection exposure apparatus that has at least one assembly with the features described above.

Further configurations of the disclosure can be taken from the description and the dependent claims.

The disclosure is explained in greater detail below on the basis of exemplary embodiments that are represented in the accompanying figures.

DETAILED DESCRIPTION OF PREFERRED EMBODIMENTS

Figure 1A:
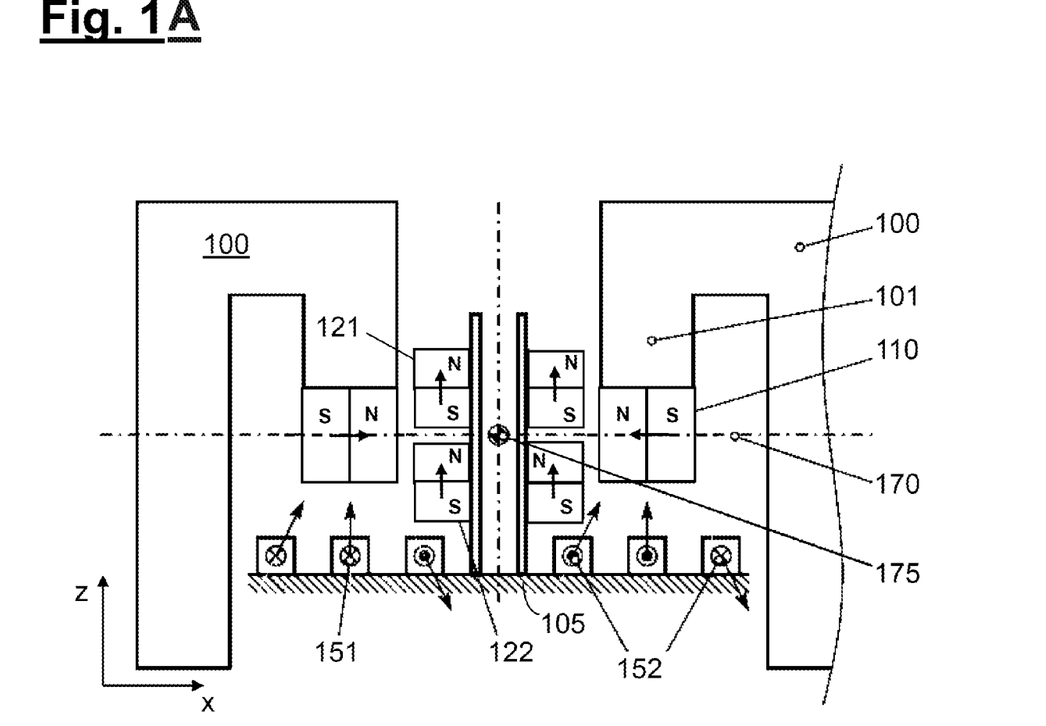
FIGS. 1A-1B and 2A-2B show schematic representations for explaining possible embodiments of an assembly according to the disclosure.
Figure 1B:
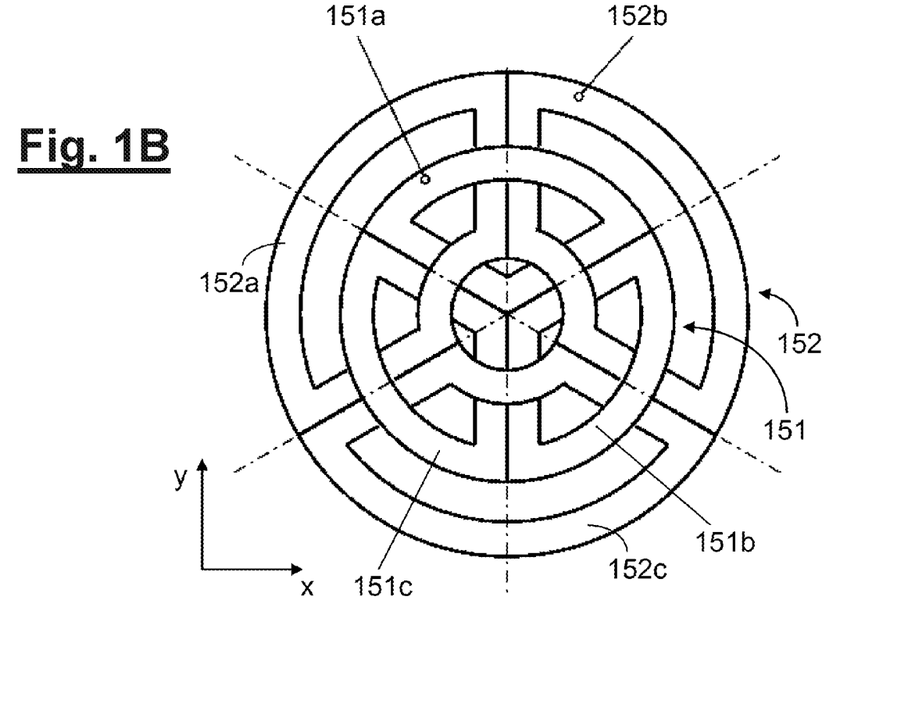

There follows first of all an explanation of a possible construction of an assembly according to the disclosure on the basis of the schematic representation of FIG. 1A-1B.

Various embodiments of an assembly according to the disclosure are described below with reference to the schematic representations in FIGS. 1A-1B and FIGS. 2A-2B.

These embodiments have in common that the coupling of a weight compensating device to an optical element to be actuated is realized by a magnetic circuit alone (i.e. in particular dispensing with a directly mechanically attached pin described at the beginning) and a reduction of the parasitic forces accompanying such a magnetic coupling is thereby achieved by a compensation for these parasitic forces being achieved by energizing a coil arrangement with electrical current.

In the assembly from FIG. 1A, a weight compensating device provided for compensating for the force of a weight acting on an optical element 100 in the form of a mirror first includes in a way known per se a (passive) magnetic circuit made up of an outer magnetic ring 151, which is polarized radially with respect to the z axis extending in the driving direction (in the system of coordinates depicted), and two magnetic rings 121, 122 arranged radially further inward, which are respectively polarized axially with respect to the z axis. Both the outer magnetic ring 110 and the inner magnetic rings 121, 122 are formed as permanent magnets.

As a difference from the conventional assembly described on the basis of FIG. 5, in the construction according to the disclosure of FIG. 1a there is no mechanical coupling in the form of a pin for the attachment of the passive magnetic circuit to the optical element 100. Instead, the attachment between the weight compensating device or passive magnetic circuit on the one hand and the optical element 100 or mirror on the other hand takes place purely magnetically, either the radially inner magnetic rings 121, 122 or the radially outer magnetic ring 110 being mechanically fixed on the movable optical element 100 and the other magnetic component or components being in each case mechanically fixed on a stationary supporting frame ("frame"), i.e. on the "fixed world".

In the specific exemplary embodiment of FIGS. 1A-1B, the radially outer magnetic ring 110 is mechanically fixed on the optical element 100 (for example screwed on), whereas the radially inner magnetic rings 121, 122 are mechanically fixed on a supporting frame 105 or on the "fixed world". Furthermore, the fixing of the radially outer magnetic ring 110 according to FIG. 1a on the optical element 100 takes place by way of a bush denoted by "101" (without the disclosure being restricted to this).

The assembly according to the disclosure that is represented in FIG. 1A in particular has no mechanical guidance, for example in the form of flexures. Without further measures, this fact would have the consequence that a movement of the optical element 100 or mirror in six degrees of freedom taking place during the operation of the assembly would be accompanied by a variation of the distances present between the magnetic rings 110 and 121, 122, in particular in the radial direction, whereby in turn parasitic magnetic forces would be transmitted in an undesired way to the optical element 100 and a deformation of the optical element 100 would be caused.

To actively compensate for such parasitic forces or disturbing forces, the assembly according to the disclosure according to FIG. 1A therefore includes a coil arrangement made up of coils that can be energized with electrical current. In the specific exemplary embodiment of FIGS. 1A-1B, this coil arrangement includes a first group 151 of coils 151a-151c and a second group 152 of coils 152a-152c. The specific arrangement of the groups 151 and 152 is shown in plan view in FIG. 1b.

The groups 151 and 152 of coils 151a-151c and 152a-152c are located in the stray magnetic field of the passive magnetic circuit formed by the magnetic rings 110 and 121, 122. Furthermore, the coils 151a-151c and 152a-152c can be energized with electrical current independently of one another.

By this energizing with electrical current, compensating forces acting in different directions—as indicated in FIG. 1A by arrows—for compensating for the aforementioned parasitic (disturbing) forces can be generated. It should be noted here that, with reference to FIG. 1B, no force effect emanates from the coil portions arranged radially with respect to the z axis, since they are arranged parallel to the magnetic field likewise extending in the radial direction, and therefore to this extent the Lorentz force is equal to zero. A force effect on the basis of the Lorentz force consequently only emanates from the coil portions which respectively do not extend parallel to the direction of the magnetic field, i.e. in the exemplary embodiment from the coil portions of the coils 251a-251c and 252a-252c that are arranged tangentially with respect to the z axis. Of these in turn the coils 151a-151c of the first group 151 generate a force in the axial direction or z direction, whereas the coils 152a-152c of the second group 152 generate force contributions with components extending both in the vertical direction or z direction and in the horizontal direction (i.e. in the x-y plane). As a result, in this way compensating forces can be generated in any desired (x, y or z) direction, and effective compensation for parasitic forces occurring can be achieved when there is movement of the optical element 100 in six degrees of freedom.

As can be seen from FIG. 1B, both the coils 151a-151c of the first group 151 and the coils 152a-152c of the second group 152 are offset in relation to one another azimuthally (in the specific exemplary embodiment by an angle of 120° in each case). The chosen "division" of the respective groups 151 and 152 respectively into three coils 151a-151c and 152a-152c advantageously has the consequence in this case that mutual compensation for the respective force contributions within the group 151 or 152 can be avoided.

Furthermore, according to FIG. 1B—but without the disclosure being restricted to this—the coils 151a-151c of the first group 151 are offset in relation to the coils 152a-152c of the second group 152 in the azimuthal direction with respect to the z axis, with the consequence that a space-saving and compact nested arrangement of the coils 151a-151c and 152a-152c that is particularly advantageous from aspects of installation space is realized. In other embodiments, however, it is also possible to dispense with such a nested and azimuthally offset arrangement, so that the coils 151a-151c of the first group 151 can also be arranged with a smaller azimuthal offset or no azimuthal offset at all in relation to the coils 152a-152c of the second group 152.

During the operation of the assembly, the compensating forces to be generated in each case by way of the coil arrangement according to the disclosure, and consequently the supply of current to the coil arrangement that is suitable in each case, can be determined for example in a calibration carried out in advance for any desired deflections of the optical element. Furthermore, the position-dependently occurring disturbing forces can also be measured by force sensors present at suitable positions. The energizing of the coils present in the coil arrangement according to the disclosure can then accordingly be performed in precisely such a way that the disturbing forces are compensated and undesired deformations of the optical element or mirror are avoided, or at least substantially reduced.

Figure 2A:
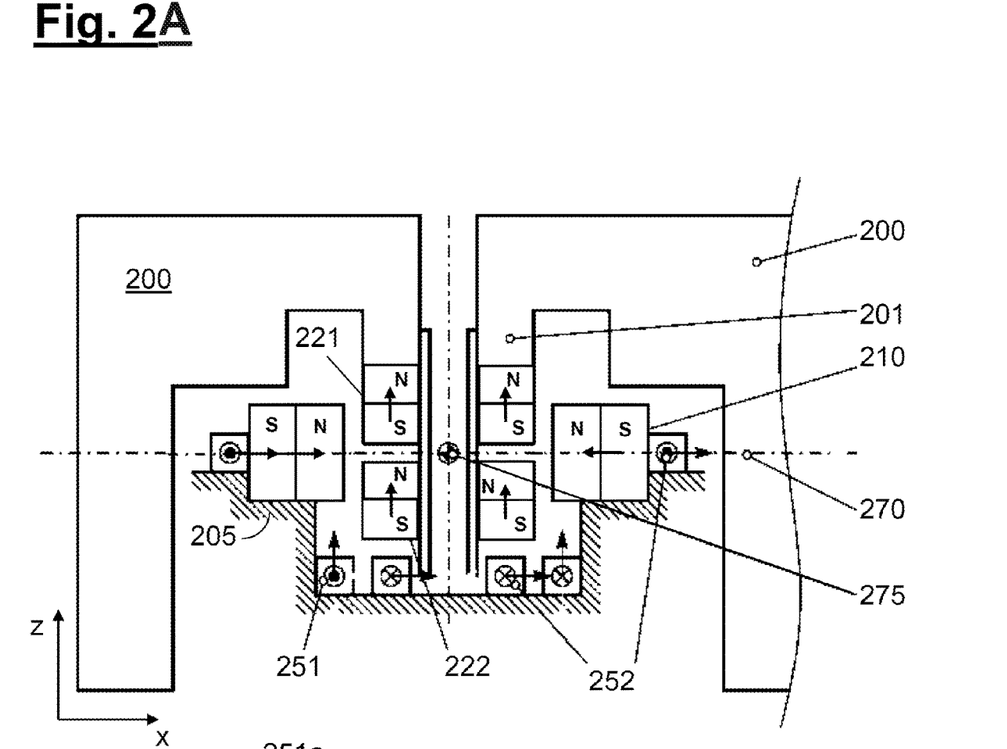
Figure 2B:
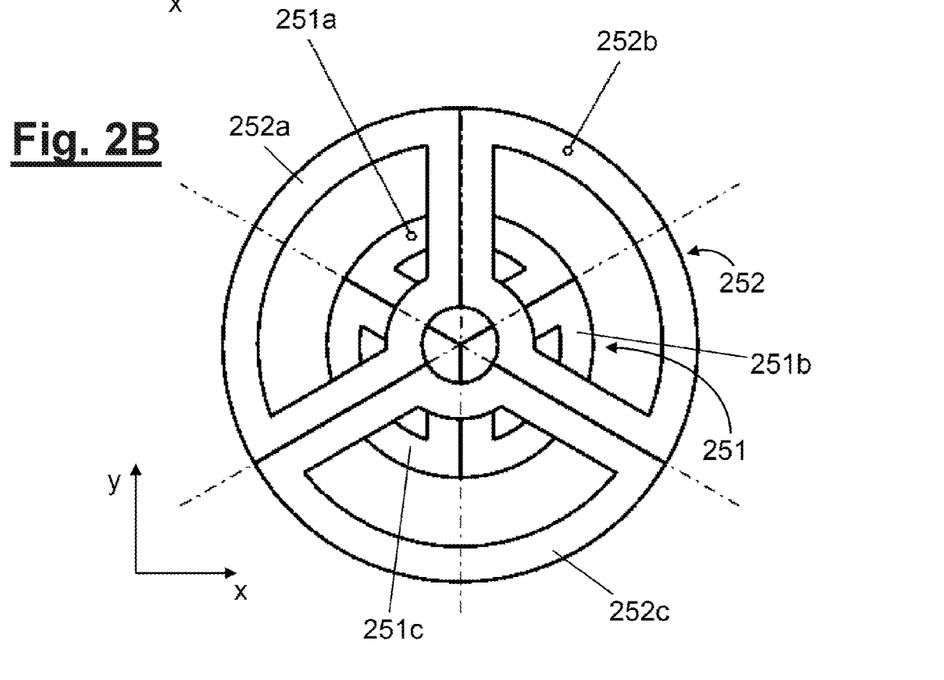

FIGS. 2A-2B show a further embodiment of an assembly according to the disclosure, components which are analogous or substantially have the same function in comparison with FIGS. 1A-1B being denoted by reference numerals increased by "100".

The assembly from FIGS. 2A-2B differs from that from FIGS. 1A-1B in that, instead of the radially outer magnetic ring 210, the two radially inner magnetic rings 212, 222 are fixed on the optical element 200 or mirror, so that, according to FIGS. 2A-2B, the radially outer magnetic ring 210 is fixed on the supporting frame 205 (i.e. on the "fixed world". The specific arrangement of the coils 251a-251c and 252a-252c is also modified accordingly, account having been taken for the position of the respective regions that has changed in comparison with FIGS. 1A-1B with a horizontally or vertically aligned magnetic field. In this case, the embodiment from FIGS. 2A-2B has a more complex design of the coil arrangement to the extent that, as a difference from FIGS. 1A-1B, the coil portions arranged in the tangential direction with respect to the z axis are no longer in one and the same plane. By contrast, however, as can be seen from FIG. 2A, a smaller structural form of the bush 201 on the optical element 200 or mirror is made possible in comparison with FIG. 1A.

The embodiments described above on the basis of FIGS. 1A-1B and FIGS. 2A-2B have in common that the coil arrangement according to the disclosure is not arranged on the optical element 100 or 200, but on the "fixed world" or the supporting frame 105, 205. One of the ways in which this is of advantage is that it allows a good thermal attachment, for example to a cooling system, and avoids heat conduction to the optical element 100, 200. However, the disclosure is not restricted to these configurations, so that embodiments with placement of the coil arrangement on the respective optical element are also intended to be included by the present application.

Figure 3:
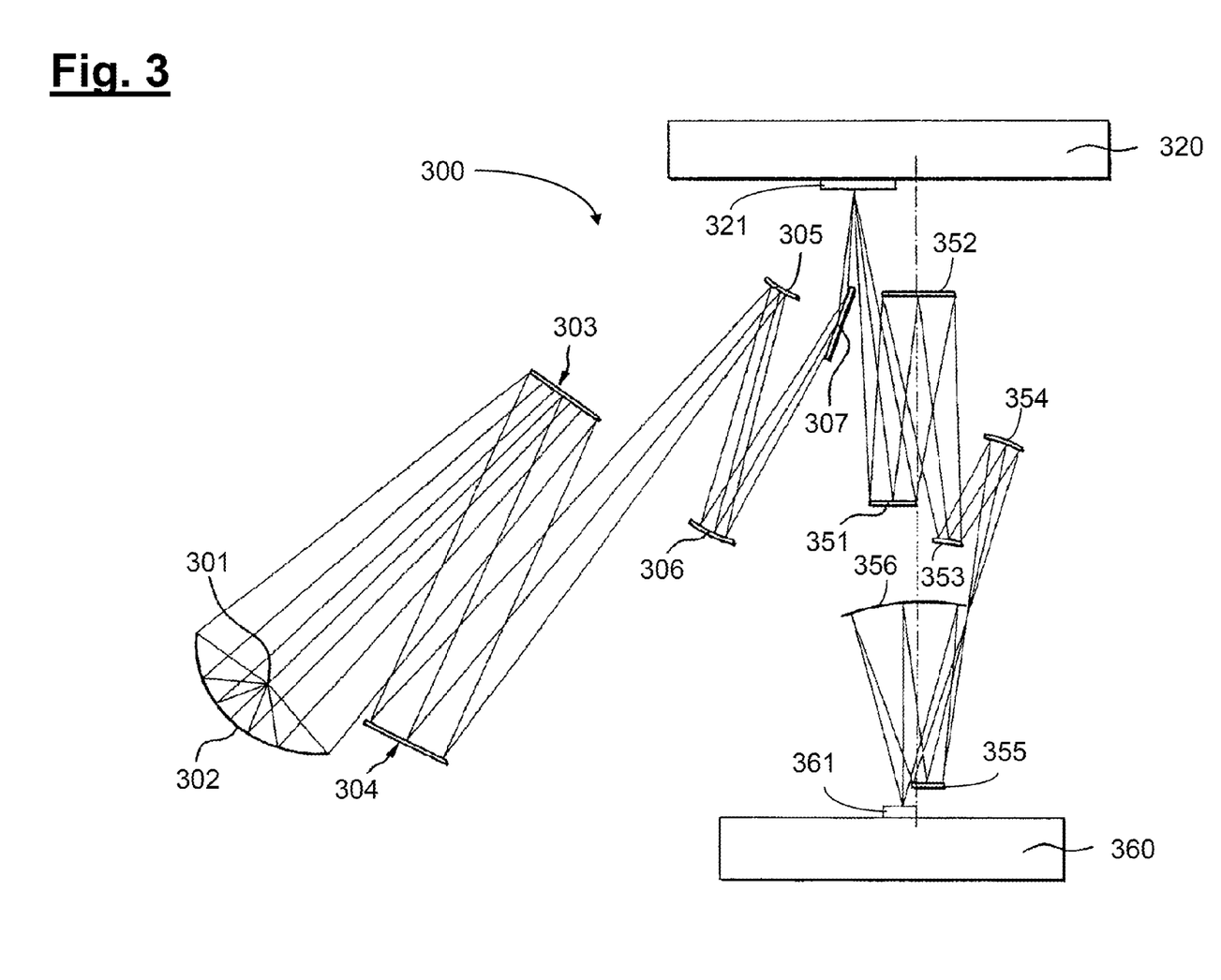
FIG. 3 shows a schematic representation of a projection exposure apparatus designed for operation in the EUV range.

FIG. 3 shows a merely schematic representation of a projection exposure apparatus 300 which is designed for operation in the EUV range and in which the present disclosure can be realized by way of example.

According to FIG. 3, an illumination device of the projection exposure apparatus 300 includes a field facet mirror 303 and a pupil facet mirror 304. The light from a light source unit including a plasma light source 301 and a collector mirror 302 is directed onto the field facet mirror 303. A first telescope mirror 305 and a second telescope mirror 306 are arranged in the light path downstream of the pupil facet mirror 304. A deflection mirror 307 operated with grazing incidence is arranged downstream in the light path and directs the radiation impinging on it onto an object field in the object plane of a projection lens with mirrors 351-356, which is merely indicated in FIG. 3. At the location of the object field, a reflective structure-bearing mask 321 is arranged on a mask stage 320, the mask being imaged with the aid of a projection lens into an image plane in which a substrate 361 coated with a light-sensitive layer (photoresist) is situated on a wafer stage 360.

Even though the disclosure has been described on the basis of specific embodiments, numerous variations and alternative embodiments are apparent to a person skilled in the art, for example by combination and/or exchange of features of individual embodiments. Accordingly, it goes without saying for a person skilled in the art that such variations and alternative embodiments are also included by the present disclosure, and the scope of the disclosure is restricted only within the meaning of the accompanying patent claims and the equivalents thereof.

What is claimed is:

1. An assembly, comprising:
   an optical element;
   a weight compensating device comprising a magnetic circuit; and
   a coil arrangement comprising a plurality of coils,
   wherein:
      the magnetic circuit is configured to generate a magnetic field to produce a first force to at least partially compensate a force of the weight acting on the optical element;
      the coil arrangement is energizable with electrical current to generate a second force configured to act on the optical element to at least partially compensate a parasitic force exerted by the magnetic circuit when there is movement of the optical element;
the second force does not contribute to the first force;
the second force has a first force contribution in a first direction; and
the second force has a second force contribution in a second direction perpendicular to the first direction.

2. The assembly of claim 1, wherein the coils are configured so that, when the magnetic circuit generates the magnetic field, the coils are at least partially located in a stray field of the magnetic circuit.

3. The assembly of claim 1, wherein the coils are energizable with electrical current independently of one another.

4. The assembly of claim 1, wherein the coil arrangement comprises at least five coils.

5. The assembly of claim 1, wherein the coil arrangement comprises at least six coils.

6. The assembly of claim 1, wherein the coil arrangement comprises:
a first group of coils that are offset in relation to one another azimuthally with respect to a system axis of the weight compensating device; and
a second group of coils that are offset in relation to one another azimuthally with respect to the system axis.

7. The assembly of claim 6, wherein the coils of the first group are offset azimuthally in relation to the coils of the second group.

8. The assembly of claim 1, wherein at least one magnet of the magnetic circuit is fixed on the optical element.

9. The assembly of claim 1, further comprising a stationary supporting frame on which at least one magnet of the magnetic circuit is fixed.

10. The assembly of claim 1, wherein the weight compensating device comprises a part that is: i) stationary in relation to the optical element; and ii) coupled to the optical element exclusively via magnetic forces.

11. The assembly of claim 1, wherein:
the weight compensating device comprises first and second magnetic rings; and
the second magnetic ring is radially further inward with respect to a system axis of the weight compensating device than the first magnetic ring.

12. The assembly of claim 11, wherein the coil arrangement is arranged outside a gap located between the first and second magnetic rings.

13. The assembly of claim 1, wherein the optical element comprises a mirror.

14. An apparatus, comprising:
the assembly of claim 1,
wherein the apparatus is a micrographic projection exposure apparatus.

15. The apparatus of claim 14, further comprising an optical system, wherein the optical system comprises the assembly.

16. An assembly, comprising:
an optical element;
a weight compensating device comprising a magnetic circuit; and
a coil arrangement comprising a plurality of coils,
wherein:
the magnetic circuit is configured to generate a magnetic field to produce a first force to at least partially compensate a force of the weight acting on the optical element;
the plurality of coils is energizable with electrical current to generate a second force configured to act on the optical element to at least partially compensate a parasitic force exerted by the magnetic circuit when there is movement of the optical element;
the second force does not contribute to the first force; and
at least some of these coils are offset azimuthally with respect to a system axis of the weight compensating device.

17. An apparatus, comprising:
the assembly of claim 16,
wherein the apparatus is a micrographic projection exposure apparatus.

18. An assembly, comprising:
an optical element;
a weight compensating device comprising a magnetic circuit;
a coil arrangement comprising a plurality of coils; and
a force sensor,
wherein:
the magnetic circuit is configured to generate a magnetic field to produce a first force to at least partially compensate a force of the weight acting on the optical element;
the plurality of coils is energizable with electrical current to generate a second force configured to act on the optical element to at least partially compensate a parasitic force exerted by the magnetic circuit when there is movement of the optical element;
the second force does not contribute to the first force; and
the force sensor is configured to measure a parasitic force exerted by the magnetic circuit when there is movement of the optical element.

19. An apparatus, comprising:
the assembly of claim 18,
wherein the apparatus is a micrographic projection exposure apparatus.

* * * * *

UNITED STATES PATENT AND TRADEMARK OFFICE
CERTIFICATE OF CORRECTION

PATENT NO. : 10,571,816 B2  
APPLICATION NO. : 16/417435  
DATED : February 25, 2020  
INVENTOR(S) : Jasper Wesselingh et al.

It is certified that error appears in the above-identified patent and that said Letters Patent is hereby corrected as shown below:

In the Specification

Column 5, Line 58, delete "FIG. 1A-1B" and insert -- Figs. 1A-1B --;

Column 6, Line 17, delete "FIG. 1$a$" and insert -- Fig. 1A --;

Column 6, Line 35, delete "FIG. 1$a$" and insert -- Fig. 1A --;

Column 6, Line 58, delete "FIG. 1$b$." and insert -- Fig. 1B. --.

Signed and Sealed this  
Fifth Day of May, 2020

Andrei Iancu  
*Director of the United States Patent and Trademark Office*